(12) United States Patent
Chen et al.

(10) Patent No.: US 9,728,596 B1
(45) Date of Patent: Aug. 8, 2017

(54) SEMICONDUCTOR DEVICE AND INTEGRATED INDUCTOR

(71) Applicant: TAIWAN SEMICONDUCTOR MANUFACTURING COMPANY LTD., Hsinchu (TW)

(72) Inventors: Chun-Chi Chen, Hsinchu (TW); Kai-Wen Cheng, Taichung (TW); Cheng-Yuan Tsai, Hsin-Chu County (TW); Kuo-Ming Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/017,093

(22) Filed: Feb. 5, 2016

(51) Int. Cl.
| | |
|---|---|
| *H01L 23/52* | (2006.01) |
| *H01L 23/64* | (2006.01) |
| *H01L 27/08* | (2006.01) |
| *H01L 29/30* | (2006.01) |
| *H01F 17/00* | (2006.01) |
| *H01L 49/02* | (2006.01) |

(52) U.S. Cl.
CPC .................................. *H01L 28/10* (2013.01)

(58) Field of Classification Search
CPC ..... H01L 23/5227; H01L 28/10; H01L 27/08; H01L 2924/3011; H01L 23/645; H01F 17/0006
USPC .......................................................... 257/531
See application file for complete search history.

(56) References Cited

U.S. PATENT DOCUMENTS

| | | | | |
|---|---|---|---|---|
| 7,356,909 | B1 * | 4/2008 | Min ....................... | B82Y 10/00 216/22 |
| 2006/0267056 | A1 * | 11/2006 | Ju .......................... | G11C 11/15 257/295 |
| 2011/0111532 | A1 * | 5/2011 | Ryu ...................... | H01L 27/228 438/3 |
| 2015/0171157 | A1 * | 6/2015 | Sturcken ............. | H01L 23/5223 257/531 |

* cited by examiner

*Primary Examiner* — John C Ingham
*Assistant Examiner* — Didarul Mazumder
(74) *Attorney, Agent, or Firm* — WPAT, P.C., Intellectual Property Attorneys; Anthony King

(57) ABSTRACT

A semiconductor structure includes a first magnetic layer, an insulative oxide layer, an oxygen trapping layer and a cap layer. The insulative oxide layer is over the first magnetic layer. The oxygen trapping layer is over the insulative oxide layer. The oxygen concentration of the oxygen trapping layer is less than an oxygen concentration of the insulative oxide layer. The cap layer is over the oxygen trapping layer.

19 Claims, 12 Drawing Sheets

SEMICONDUCTOR DEVICE AND INTEGRATED INDUCTOR

BACKGROUND

Inductors have been used in a variety of microelectronic circuit applications such as transformers, power converters, electromagnetic interference (EMI) noise reduction, and radio frequency (RF) and microwave circuitry including oscillators, amplifiers, and matching networks.

The major trend in the electronic industry is to make the electronic components lighter, smaller, more powerful, more reliable and less expensive. Thus, electronic devices including inductors are expected to be formed on chip, i.e. the inductors are expected to be either integrated on an integrated circuit and/or formed in a semiconductor package.

BRIEF DESCRIPTION OF THE DRAWINGS

Aspects of the present disclosure are best understood from the following detailed description when read with the accompanying figures. It is rioted that, in accordance with the standard practice in the industry, various features are not drawn to scale. In fact, the dimensions of the various features may be arbitrarily increased or reduced for clarity of discussion.

DETAILED DESCRIPTION

Figure 1:
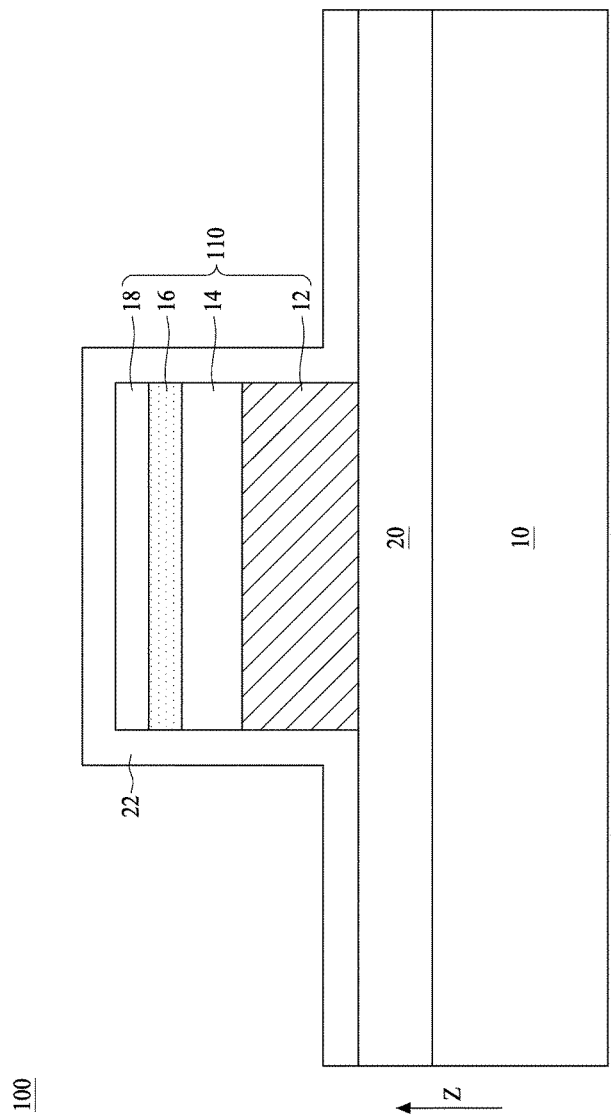
FIG. 1 is a schematic cross-sectional view of some embodiments of a semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

In the present disclosure, a semiconductor device includes a magnetic layer, an insulative layer, a barrier layer and a conductive layer stacked to one another. The semiconductor device can be used as an integrated inductor with magnetic core. The semiconductor device can be used in a variety of microelectronic circuit applications such as transformers, power converters, electromagnetic interference (EMI) noise reduction, and radio frequency (RF) and microwave circuitry including oscillators, amplifiers, and matching networks. The exact functionality of the semiconductor device 100 is not a limitation to the provided subject matter.

In the present disclosure, the barrier layer disposed between the insulative layer and the conductive layer is an oxygen trapping layer, which is configured to trap particles and prevent particles from diffusing to the conductive layer.

FIG. 1 is a schematic cross-sectional view of some embodiments of a semiconductor device 100. The semiconductor device 100 may be a semiconductor structure, which is compatible with semiconductor manufacturing processes. In some embodiments, the semiconductor device 100 is an integrated inductor, or at least a part of an integrated inductor. The semiconductor device 100 includes a first magnetic layer 12, an insulative oxide layer 14, an oxygen trapping layer 16 and a cap layer 18. The first magnetic layer 12 may be disposed over a semiconductor substrate 10, e.g. a silicon substrate, or the like. In some embodiments, the semiconductor substrate 10 includes an active device e.g. a MOSFET (metal oxide semiconductor field effect transistor), and/or a passive device e.g. a resistor, a capacitor formed therein or thereon. In some embodiments, the first magnetic layer 12 may also be disposed over any overlying layer 20 on the semiconductor substrate 10. In some embodiments, the overlying layer 20 includes an interconnect e.g. a conductive post, a through insulation via (TIV) or the like, and/or an inter-dielectric layer e.g. an inorganic dielectric layer, an organic dielectric layer or the like. The first magnetic layer 12 is formed of magnetic material. For example, the first magnetic layer 12 may include cobalt, an alloy comprising cobalt and zirconium, an alloy comprising cobalt and iron, an alloy of nickel and iron, an alloy comprising an alloy comprising cobalt, zirconium and at least one of tantalum, niobium or rhenium, an alloy comprising cobalt, tungsten and phosphorous, an alloy comprising cobalt, nickel and iron, an alloy comprising iron, nickel and phosphorous, or the like. In some embodiments, the first magnetic layer 12 is an alloy of cobalt zirconium tantalum (CoZrTa or CZA). In some embodiments, the thickness of the first magnetic layer 12 is about several thousand angstroms, e.g. about 2000 angstroms, but not limited thereto.

In some embodiments, the first magnetic layer 12 is electrically connected/coupled to the interconnect and/or the active device.

The insulative oxide layer 14 is located over the first magnetic layer 12. The insulative oxide layer 14 may include an oxide of cobalt, zirconium and at least one of tantalum, niobium or rhenium, or the like. In some embodiments, the insulative oxide layer 14 is an oxide of cobalt, zirconium and tantalum. In some embodiments, the thickness of the insulative oxide layer 14 is about several hundred angstroms e.g. 150 angstroms, but not limited thereto. In some embodiments, the insulative oxide layer 14 is an oxide form of the magnetic layer 12.

The oxygen trapping layer 16 is positioned over the insulative oxide layer 14. In some embodiments, the oxygen trapping layer 16 is configured as a barrier layer to block oxygen atoms from entering an overlying layer e.g. a cap layer 18. In some embodiments, the oxygen trapping layer 16 is configured as a transition layer to enhance the adhesion between the insulative oxide layer 14 and the overlying layer e.g. the cap layer 18. The oxygen trapping layer 16 may include an oxide of cobalt, zirconium and at least one of tantalum, niobium or rhenium, or the like. In some embodiments, the oxygen trapping layer 16 is an oxide of cobalt, zirconium and tantalum. In some embodiments, the insulative oxide layer 14 and the oxygen trapping layer 16 comprise the same elements but different composition ratios. In some embodiments, the oxygen trapping layer 16 and the insulative oxide layer 14 are both oxides of the first magnetic layer 12 with different composition ratios. For example, the insulative oxide layer 14 and the oxygen trapping layer 16 are both oxides of cobalt, zirconium and tantalum, and the oxygen concentration of the oxygen trapping layer 16 is less than an oxygen concentration of the insulative oxide layer 14. That is, the oxygen trapping layer 16 is oxygen-less insulative oxide layer, which is able to trap oxygen atoms. In some embodiments, the ratio of the oxygen concentration of the oxygen trapping layer 16 to the oxygen concentration of the insulative oxide layer 14 ranges from about 10% to about 40%, but not limited thereto. In some embodiments, the thickness of the oxygen trapping layer 16 is greater than 10 angstroms. In some embodiments, the thickness of the oxygen trapping layer 16 is about 50 angstroms, but not limited thereto.

The cap layer 18 is located over the oxygen trapping layer 16. The cap layer 18 is a conductive layer. In some embodiments, the cap layer 18 includes tantalum, or other conductive material. In some embodiments, the thickness of the cap layer 18 is greater than 10 angstroms. In some embodiments, the thickness of the cap layer 18 is about 50 angstroms, but not limited thereto.

As shown in FIG. 1, the first magnetic layer 12, the insulative oxide layer 14, the oxygen trapping layer 16 and the cap layer 18 are stacked as a laminated unit 110 in a direction Z substantially parallel to the thickness direction of the substrate 10. In some embodiments, at least some portions of the laminated unit 110 e.g. the first magnetic layer 12 is configured as a magnetic core of an integrated inductor. In some alternative embodiment, the laminated unit 110 is configured as another device or at least a part of a device.

In some embodiments, the laminated unit 110 is covered with at least one insulative layer 22 to protect the laminated unit 110 or to isolate the laminated unit 110 from an overlying and/or adjacent conductive feature. In some embodiments, the insulative layer 22 is conformal to some external surfaces of the laminated unit 110. The insulative layer may include an inorganic insulative layer e.g. an oxide layer, a nitride layer, an oxynitride layer or the like, and/or an organic layer e.g. a polybenzoxazole (PRO) layer or the like. In some embodiments, a conductive layer e.g. a copper coil is over the insulative layer to form an integrated inductor. In some alternative embodiments, the conductive coil is disposed under the laminated unit 110, and the insulative layer is interposed between the conductive coil and the laminated unit 110.

The structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 2:
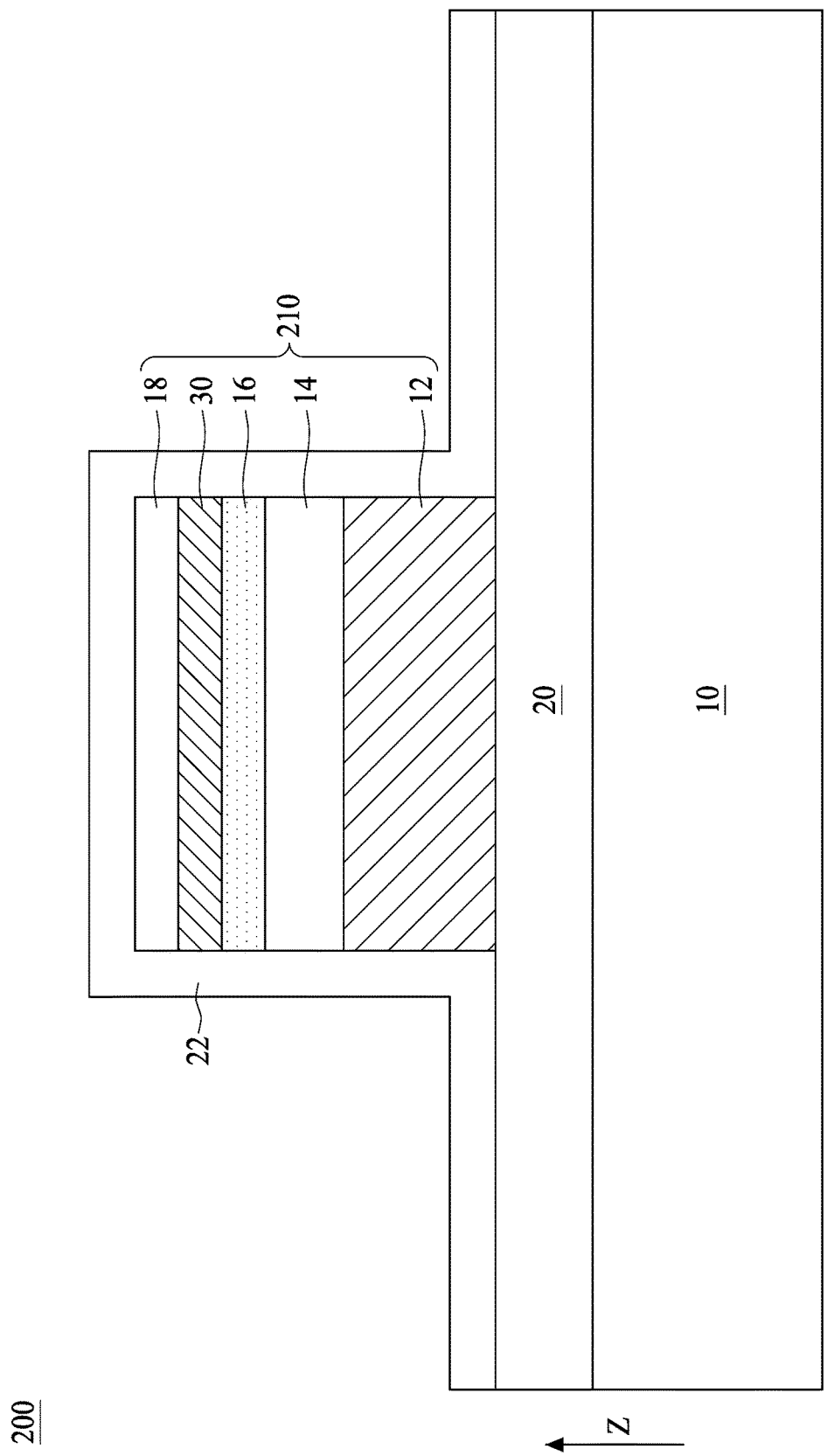
FIG. 2 is a schematic cross-sectional view of some embodiments of a semiconductor device.

FIG. 2 is a schematic cross-sectional view of some embodiments of a semiconductor device 200. The semiconductor device 200 includes first magnetic layer 12, insulative oxide layer 14, oxygen trapping layer 16, cap layer 18 and a second magnetic layer 30. The first magnetic layer 12 is disposed over a substrate 10 or any overlying layer 20 on the semiconductor substrate 10. The insulative oxide layer 14 is located over the first magnetic layer 12. The oxygen trapping layer 16 is positioned over the insulative oxide layer 14. The cap layer 18 is located over the oxygen trapping layer 16. One difference between the semiconductor device 200 and the semiconductor device 100 is that the semiconductor device 200 further includes the second magnetic layer 30 interposed between the oxygen trapping layer 16 and the cap layer 18. In some embodiments, the second magnetic layer 30 may include cobalt, an alloy comprising cobalt and zirconium, an alloy comprising cobalt, zirconium, and at least one of tantalum, niobium or rhenium, or the like. In some embodiments, the second magnetic layer 30 is a cobalt zirconium tantalum (CoZrTa or CZA) alloy. The material of the second magnetic layer 30 may be the same as or different from the material of the first magnetic layer 12. In some embodiments, the second magnetic layer 30 is configured to further enhance the adhesion between the insulative oxide layer 14 and the cap layer 18.

The first magnetic layer 12, the insulative oxide layer 14, the oxygen trapping layer 16, the second magnetic layer 30 and the cap layer 18 are stacked as a laminated unit 210 in a direction Z substantially parallel to the thickness direction of the substrate 10. In some embodiments, the laminated unit 210 of the first magnetic layer 12, the insulative oxide layer 14, the oxygen trapping layer 16, the second magnetic layer 30 and the cap layer 18 is configured as a magnetic core of an integrated inductor. In some alternative embodiment, the laminated unit 210 is configured as at least a part of another device with another functionality.

Figure 3:
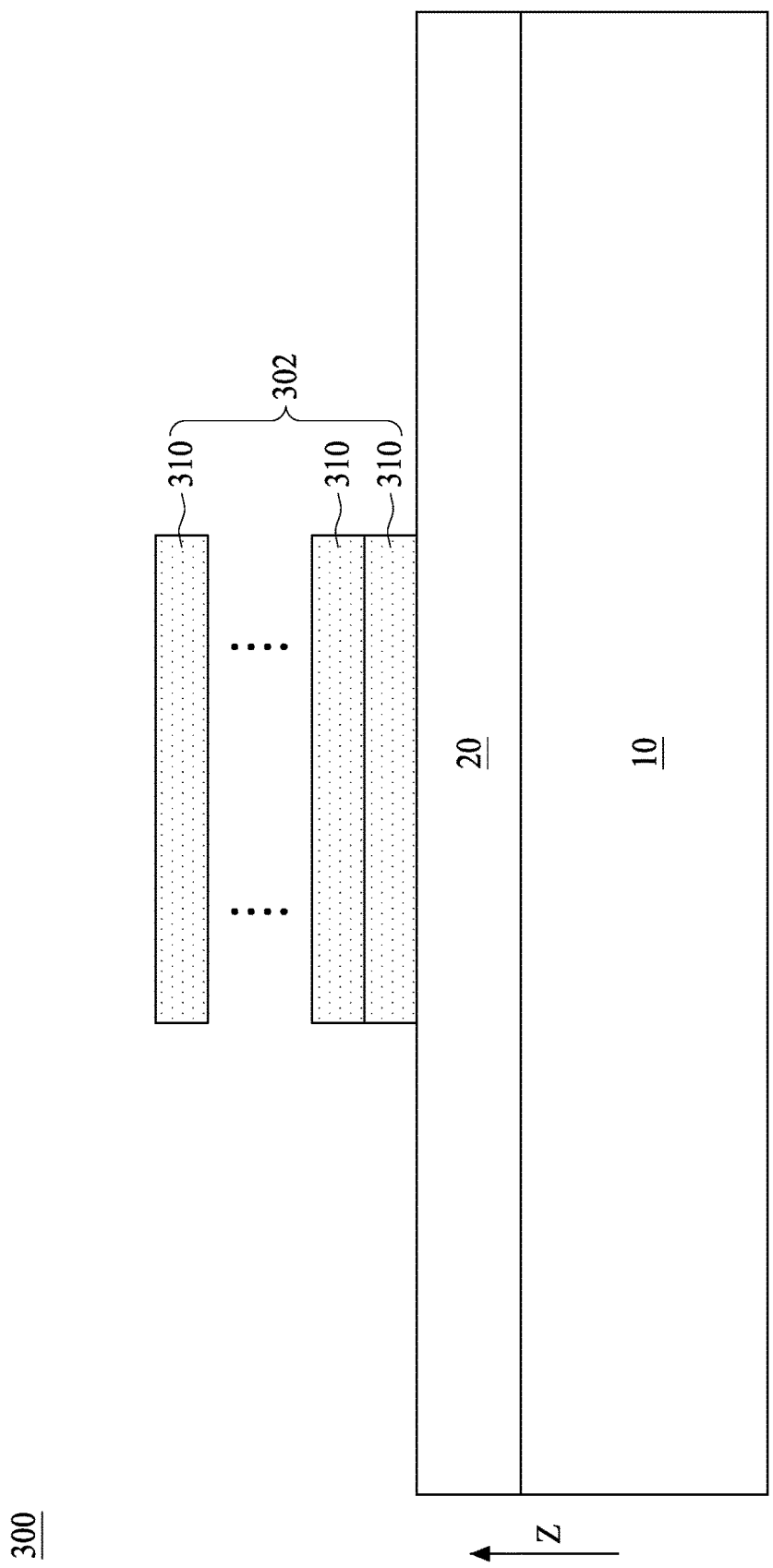
FIG. 3 is a schematic cross-sectional view of some embodiments of a semiconductor device.

FIG. 3 is a schematic cross-sectional view of some embodiments of a semiconductor device 300. In some embodiments, the semiconductor device 300 includes a film stack 302 over the semiconductor substrate 10. The film stack 302 includes a plurality of laminated units 310 repeatedly stacked over the semiconductor substrate 10 in the direction Z. In some embodiments, the laminated units 310 comprise the laminated units 110 of FIG. 1. In some alternative embodiments, the laminated units 310 comprise the laminated units 210 of FIG. 2. In still other alternative embodiments, some of the laminated units 310 comprise the laminated units 110 of FIG. 1, and some of the laminated units 310 comprise the laminated units 210 of FIG. 2. The number of stacking of the laminated units 310 may be selected based on inductance and/or thermal stability consideration. In some embodiments, the sidewall and/or upper surface of the film stack 302 is covered with an insulative layer (not shown).

Figure 4:
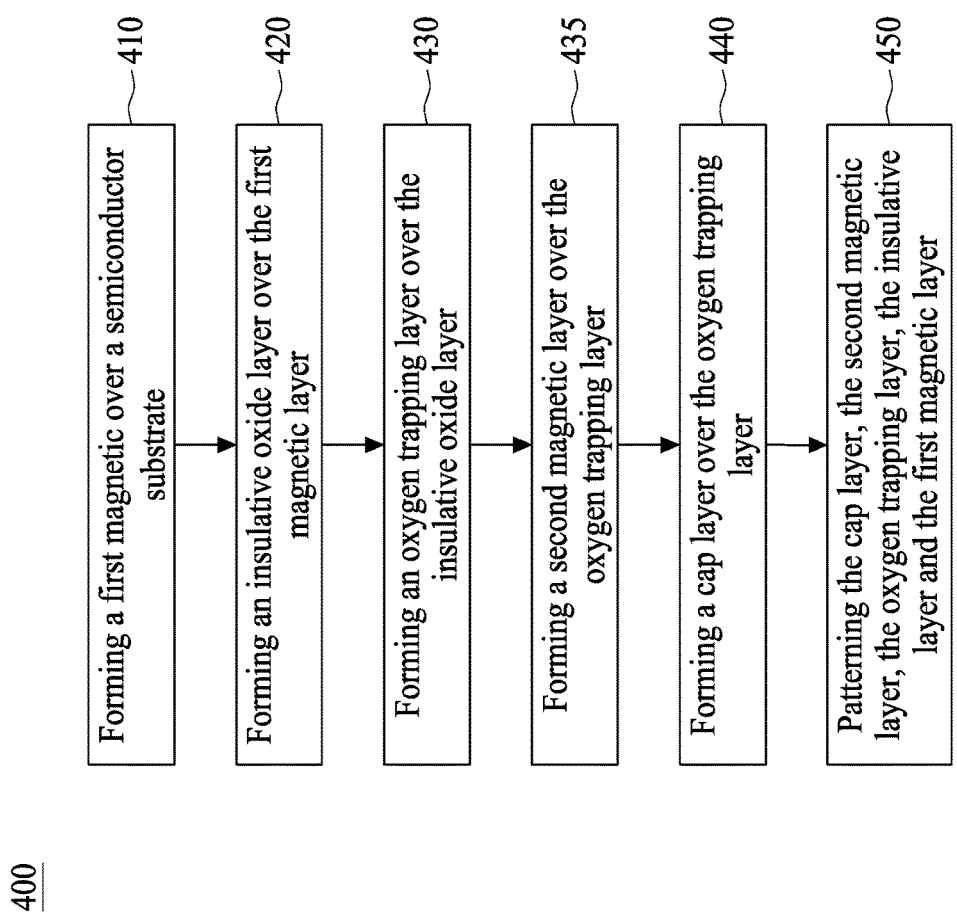
FIG. 4 is a flowchart of a method of manufacturing a semiconductor device according to some embodiments of the present disclosure.

FIG. 4 is a flowchart of a method 400 of manufacturing a semiconductor device according to some embodiments of the present disclosure. It is understood that additional operations can be provided before, during, and after the method 400, and some of the operations described can be replaced or eliminated for other embodiments of the method. The method 400 begins at operation 410 in which a first magnetic layer is formed over a semiconductor substrate. The method 400 continues with operation 420 in which an insulative oxide layer is formed over the first magnetic layer. The method 400 continues with operation 430 in which an oxygen trapping layer is formed over the insulative oxide layer. The oxygen concentration of the oxygen trapping layer is less than the oxygen concentration of the insulative oxide layer. In some embodiments, the method 400 includes operation 435 subsequent to operations 430 in which a second magnetic layer is optionally formed over the oxygen trapping layer. The method 400 continues with operation 440 in which a cap layer is formed over the oxygen trapping layer. The method 400 continues with operation 450 in which the cap layer, the second magnetic layer (if exists), the oxygen trapping layer, the insulative layer and the first magnetic layer are patterned to form a laminated structure.

Figure 5A:
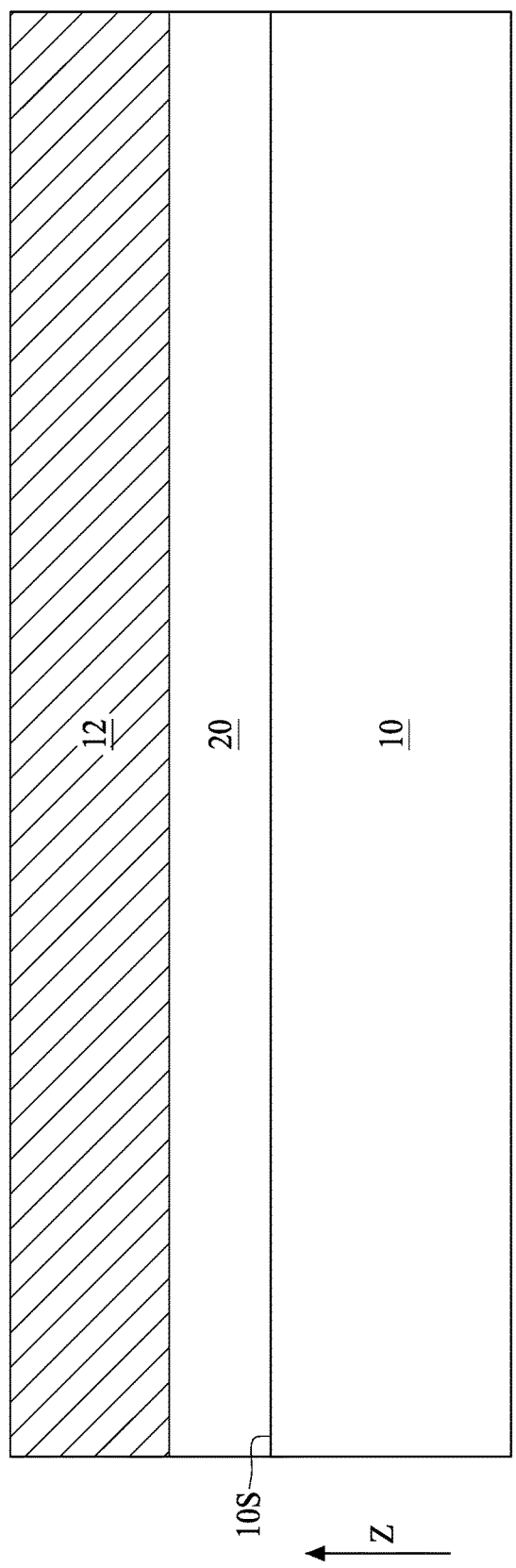
FIGS. 5A, 5B, 5C, 5D and 5E are cross-sectional views at one of various operations of manufacturing a semiconductor device according to some embodiments of the present disclosure.

FIGS. 5A, 5B, 5C, 5D and 5E are cross-sectional views at one of various operations of manufacturing a semiconductor device according to some embodiments of the present disclosure. As depicted in FIG. 5A and operation 410 in FIG. 4, the method 400 begins at operation 410 in which a first magnetic layer 12 is formed over a semiconductor substrate 10 e.g. over a surface 10S of the semiconductor substrate 10. In some embodiments, an active device e.g. a MOSFET (metal oxide semiconductor field effect transistor) or the like is formed in the semiconductor substrate 10. In some embodiments, the first magnetic layer 12 is formed over an overlying layer 20 over the semiconductor substrate 10. The overlying layer 20 may include an interconnect e.g. a conductive post, a through insulation via (TIV) or the like, and/or an inter-dielectric layer e.g. an inorganic dielectric layer, an organic dielectric layer or the like. In some embodiments, the first magnetic layer 12 is a CZT layer, and is formed by a physical vapor deposition (PVD) such as sputtering or the like. In the PVD operation, a target e.g. a CZT target is bombarded by plasma e.g. argon (Ar) plasma, and the CZT material is deposited over the substrate 10 or the overlying layer 20 to form the first magnetic layer 12. The first magnetic layer 12 may be formed by PVD or other deposition method.

Figure 5B:
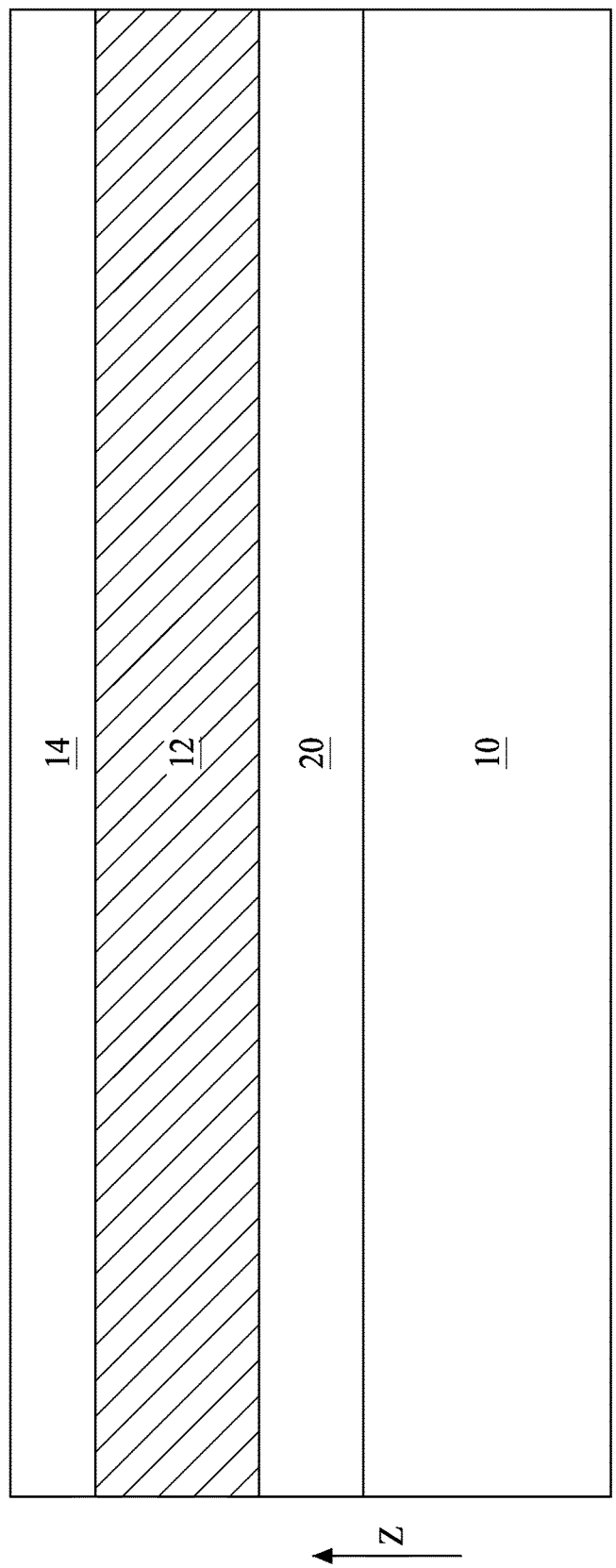

As depicted in FIG. 5B and operation 420 in FIG. 4, the method 400 continues with operation 420 in which an insulative oxide layer 14 is formed over the first magnetic layer 12. In some embodiments, the insulative oxide layer 14 is a CZT oxide layer, and is formed by a PVD such as sputtering or the like. The insulative oxide layer 14 may be formed by PVD or other deposition method. In the PVD operation, a target e.g. a CZT oxide target is bombarded by plasma e.g. oxygen plasma, and the CZT oxide material is deposited over the first magnetic layer 12 to form the insulative oxide layer 14. In some alternative embodiments, the insulative oxide layer 14 is formed by oxidizing a portion of the CZT layer proximal to the external surface of the CZT layer to form a CZT oxide layer as the insulative oxide layer 14.

Figure 5C:
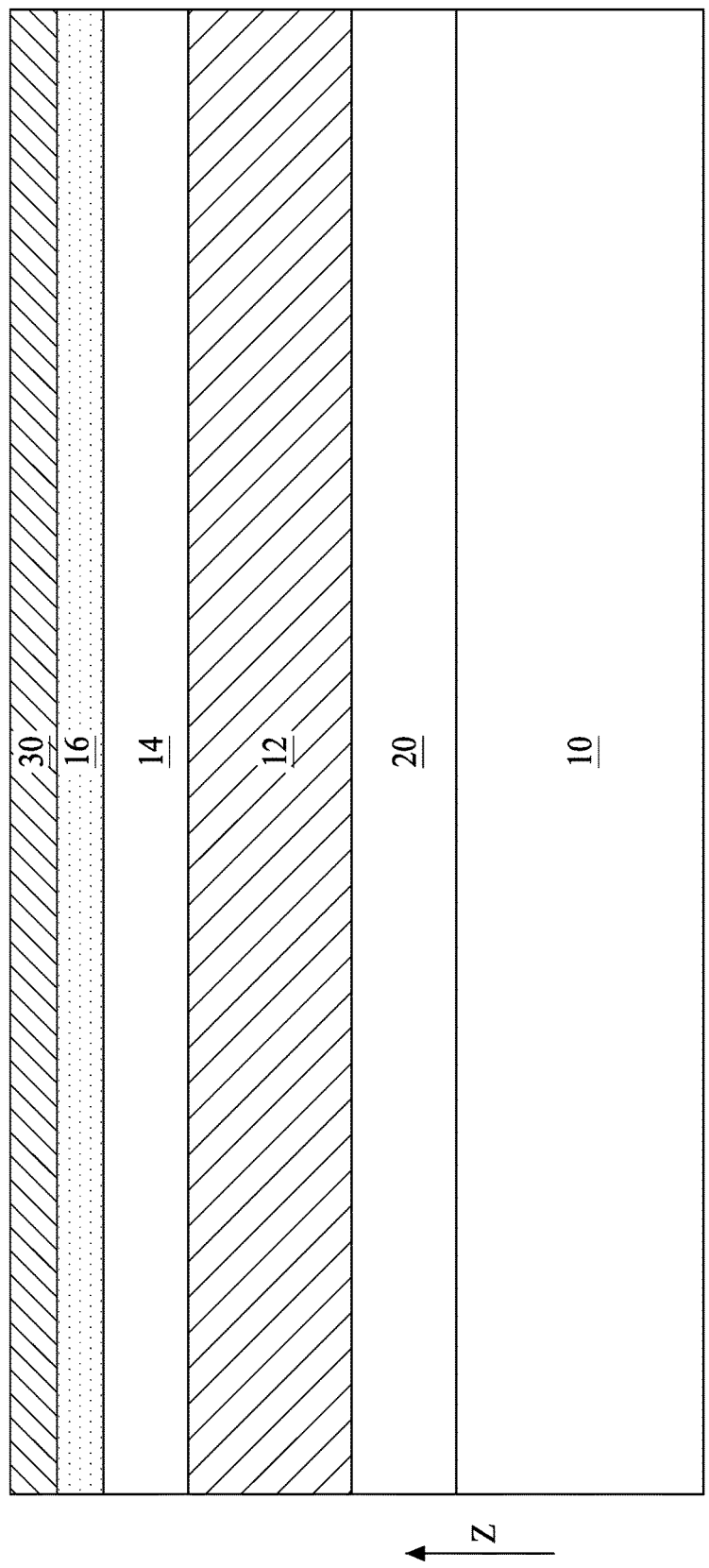

As depicted in FIG. 5C and operation 430 in FIG. 4, the method 400 continues with operation 430 in which an oxygen trapping layer 16 is formed over the insulative oxide layer 14. In some embodiments, the oxygen trapping layer 16 is oxygen-less CZT oxide, and is formed by a PVD such as sputtering or the like. The oxygen trapping layer 16 may be formed by PVD or other deposition method. In the PVD operation, a target e.g. a CZT oxide target is bombarded by plasma e.g. argon plasma, and the CZT oxide material is deposited over the insulative oxide layer 14 to form the oxygen trapping layer 16. The oxygen concentration of the oxygen trapping layer 16 is less than the oxygen concentration of the insulative oxide layer 14. For example, the ratio of the oxygen concentration of the oxygen trapping layer 16 to the oxygen concentration of the insulative oxide layer 14 ranges from about 10% to about 40%.

In some embodiments, the first magnetic layer 12, the insulative oxide layer 14 and the oxygen trapping layer 16 are formed in an in-situ manner. For example, the substrate 10 is loaded into a PVD chamber, and a CZT target is bombarded by e.g. argon plasma having a power of e.g. 8 KW to deposit a CZT layer over the substrate 10 or the overlying layer 20 as the first magnetic layer 12. The CZT target is then bombarded by e.g. oxygen plasma having a power of e.g. 8 KW to form a CZT oxide film covering the CZT target, and the CZT oxide material is deposited on the first magnetic layer 12 to form an oxygen-rich CZT oxide layer as the insulative oxide layer 14. The CZT target covering by CZT oxide film is then bombarded by e.g. argon plasma having a power of e.g. 1 KW to form an oxygen-less CZT oxide layer on the insulative oxide layer 14 as the oxygen trapping layer 16.

Since the oxygen trapping layer 16 is formed in an oxygen-less atmosphere with lower power plasma while the insulative oxide layer 14 is formed in an oxygen-rich atmosphere with higher power plasma, the oxygen concentration of the oxygen trapping layer 16 is accordingly less than the oxygen concentration of the insulative oxide layer 14. The ratio of the oxygen concentration of the oxygen trapping layer 16 to the oxygen concentration of the insulative oxide layer 14 can be adjusted, for example, by tuning the parameters e.g. power and type of plasma. In some embodiment, the ratio of the oxygen concentration of the oxygen trapping layer 16 to the oxygen concentration of the insulative oxide layer 14 ranges from about 10% to about 40%.

In some embodiments, the second magnetic layer 30 is formed over the oxygen trapping layer 16. The material of the second magnetic layer 30 may be the same as that of the first magnetic layer 12, and is formed by a physical vapor deposition (PVD) such as sputtering or the like. In some alternative embodiments, the material of second magnetic layer 30 is different from that of the first magnetic layer 12.

Figure 5D:
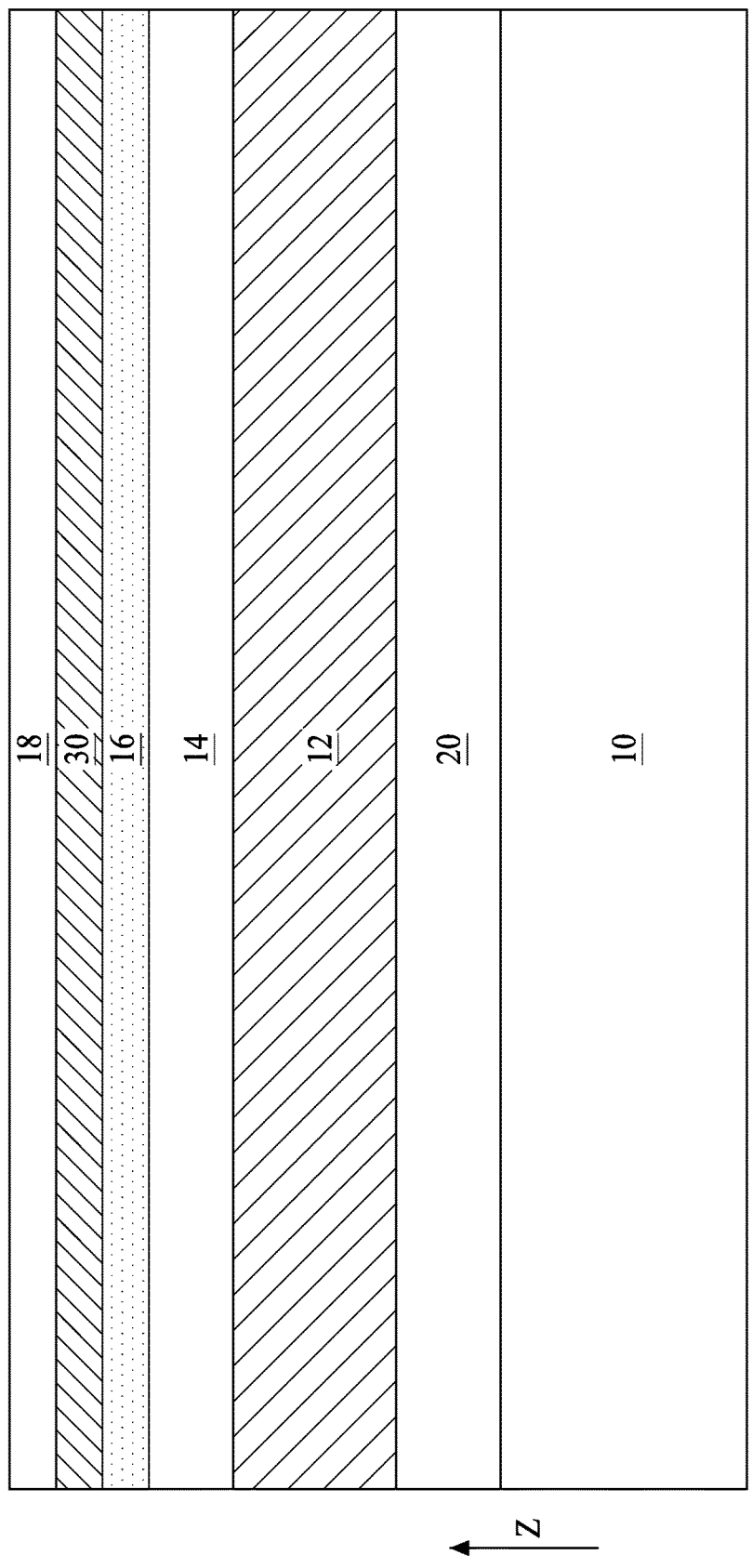

As depicted in FIG. 5D and operation 440 in FIG. 4, the method 400 continues with operation 440 in which the cap layer 18 is formed over the oxygen trapping layer 16. The cap layer 18 may be formed by PVD or other deposition method. In some embodiments, the cap layer 18 is a tantalum layer. In some embodiments, an annealing operation is performed upon the first magnetic layer 12 to adjust its material characteristics such as stress, arrangement or magnetic anisotropy. In some embodiments, the oxygen trapping layer 16 is configured as a barrier layer to block oxygen atoms out-diffused from the insulative oxide layer 14 from reacting with the cap layer 18 during the annealing operation, thereby impeding generation of oxide of the material of the cap layer 18. For example, when the insulative oxide layer 14 is a CZT oxide layer, the oxygen trapping layer 16 is an oxygen-less CZT oxide layer and the cap layer 18 is a tantalum layer, the oxygen-less CZT oxide layer will trap oxygen atoms out-diffused from the CZT oxide layer during the annealing operation, thereby impeding generation of tantalum oxide.

Figure 5E:
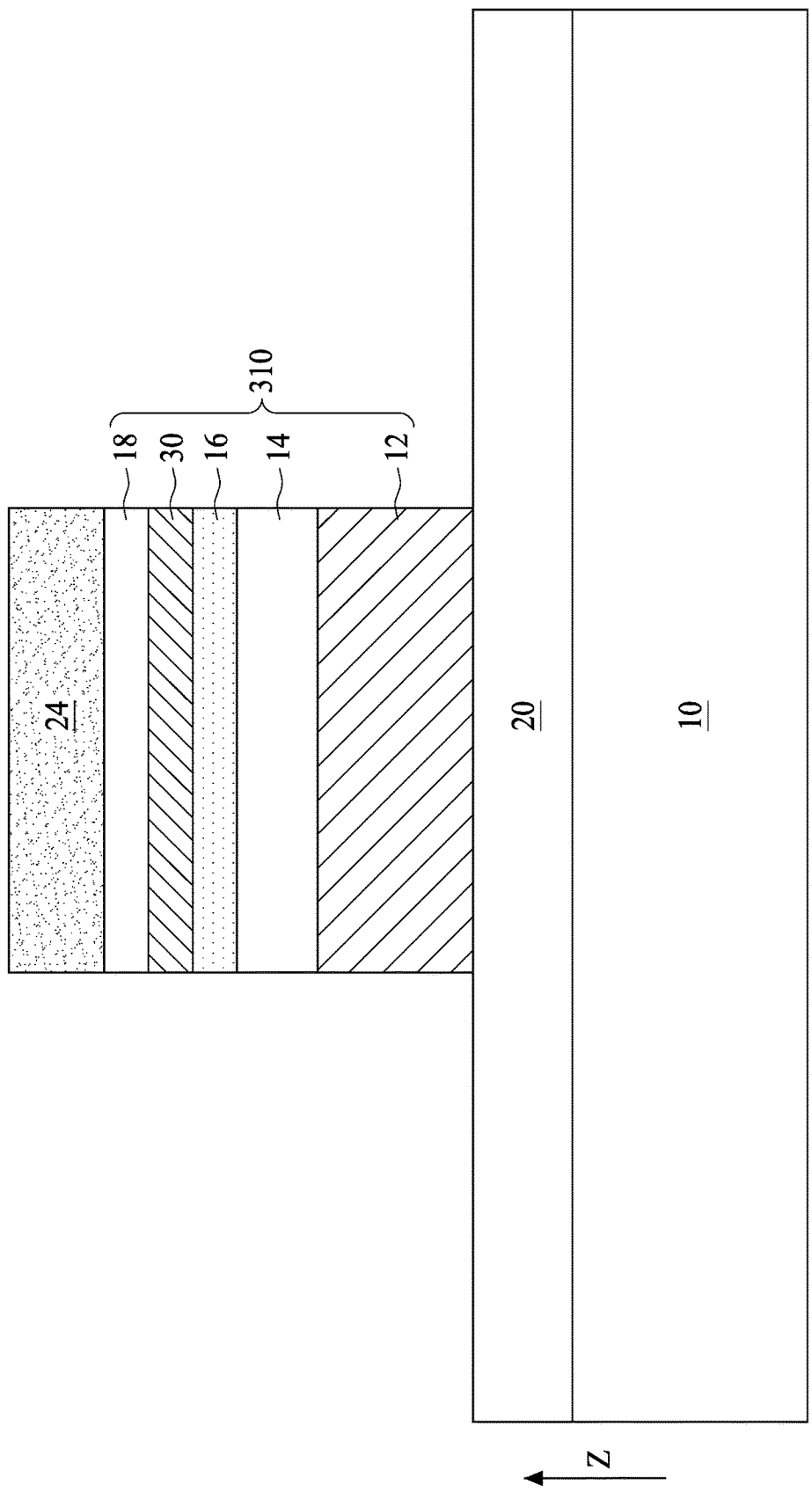

As depicted in FIG. 5E and operation 450 in FIG. 4, the method 400 continues with operation 450 in which the cap layer 18, the oxygen trapping layer 16, the insulative layer 14 and the first magnetic layer 12 are patterned to form a laminated structure. In some embodiment, the oxygen trapping layer 16, the insulative layer 14 and the first magnetic layer 12 are patterned by etching e.g. wet etching using a patterned resist layer 24 e.g. a photoresist layer formed over the cap layer 18. In some embodiments, the etching solution of the wet etching comprises a solution of hydrofluoric acid (HF), nitric acid ($HNO_3$) and water ($H_2O$), and the composition ratio may be adjusted. In some embodiments, the composition ratio of hydrofluoric acid, nitric acid and water is $HF:HNO_3:H_2O=x:y:z$, where x is between about 0.5 and about 1.5, y is between about 2 and about 6, and z is between about 7 and about 13. In some embodiments, $HF:HNO_3:H_2O=1:4:10$. In still some embodiments, $HF:HNO_3:H_2O=2:3:8$. Another etching solution may be selected depending on the materials of the cap layer 18, the oxygen trapping layer 16, the insulative oxide layer 14 and the first magnetic layer 12. While, not otherwise depicted, the patterned resist layer 24 is then removed after the cap layer 18, the oxygen trapping layer 16, the insulative layer 14 and the first magnetic layer 12 are patterned.

The first magnetic layer 12, the insulative oxide layer 14 and the cap layer 18 have diverse etching rates due to their different material characteristics. In some embodiment, the first magnetic layer 12 is a CZT layer, the insulative oxide layer 14 is a CZT oxide layer, the oxygen trapping layer 16 is an oxygen-less CZT oxide layer, the second magnetic layer 30 is a CZT layer, the cap layer 18 is a Ta (tantalum) layer, and the etching solution is hydrofluoric acid (HF), nitric acid ($HNO_3$) and water ($H_2O$) solution in which $HP:HNO_3:H_2O=1:4:10$. In the instant case, the etching rate of CZT is about 785 A/sec (angstrom/second), the etching rate of CZT oxide is about 27 A/sec, and the etching rate of Ta is about 3 A/sec. With the high etching selectivity between Ta and CZT, lateral etching tends to occur. In the present disclosure, the oxygen trapping layer (oxygen-less CZT oxide layer) 16 between the insulative oxide layer (CZT oxide layer) 14 and the cap layer (Ta layer) is configured to trap oxygen atoms out-diffused from the CZT oxide layer during the annealing operation, thereby impeding generation of tantalum oxide layer (TaO layer) between the cap layer 18 and the oxygen trapping layer 16. The etching rate of tantalum oxide is even lower than the etching rate of tantalum. Consequently, the lateral etching of the semiconductor device with the oxygen-less CZT oxide is impeded compared to the lateral etching of the semiconductor device without oxygen-less CZT oxide layer.

Figure 6A:
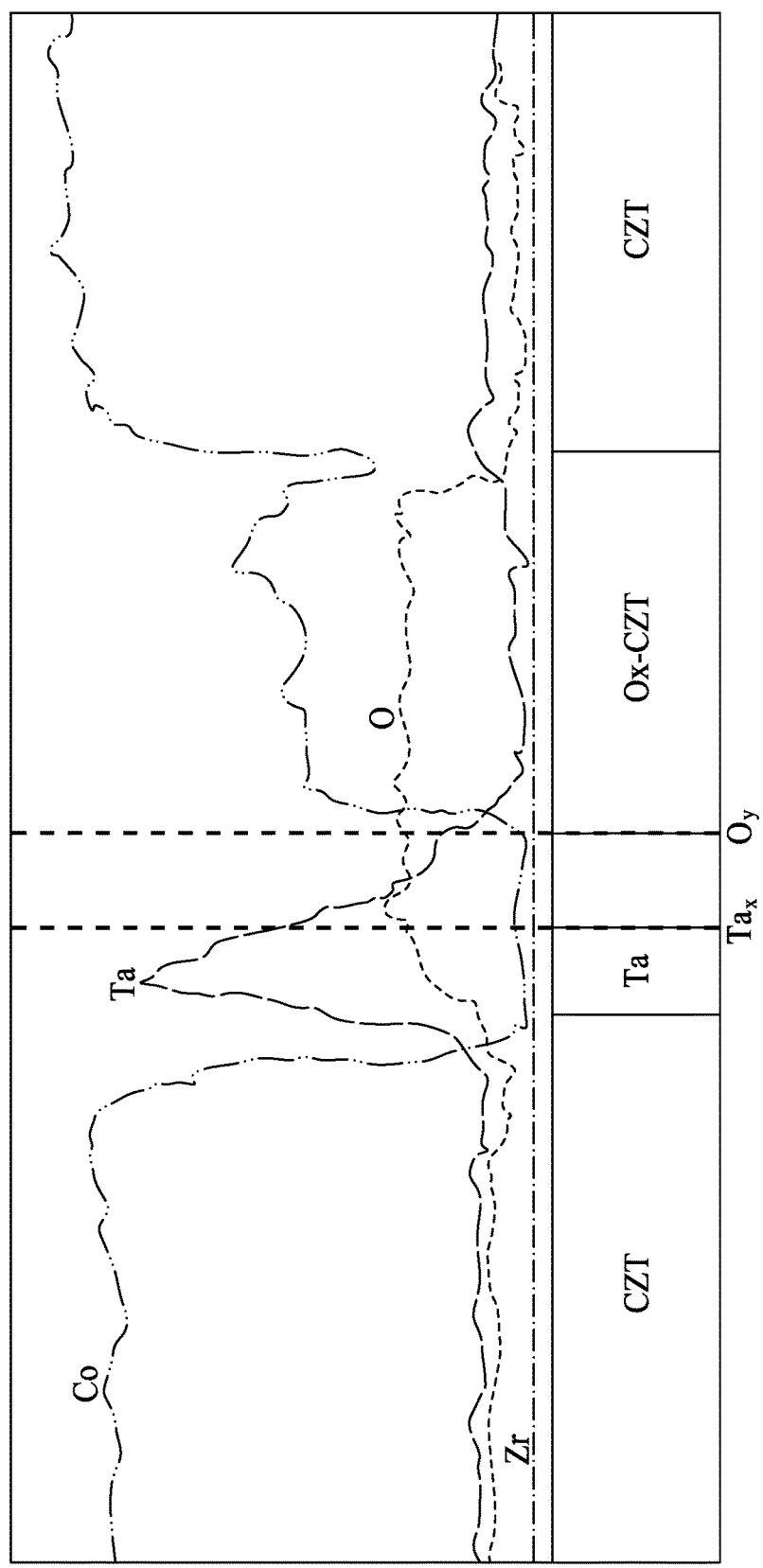
FIG. 6A is a simulation chart illustrating a TEM EDX line scan simulation of a laminated unit without oxygen trapping layer.
Figure 6B:
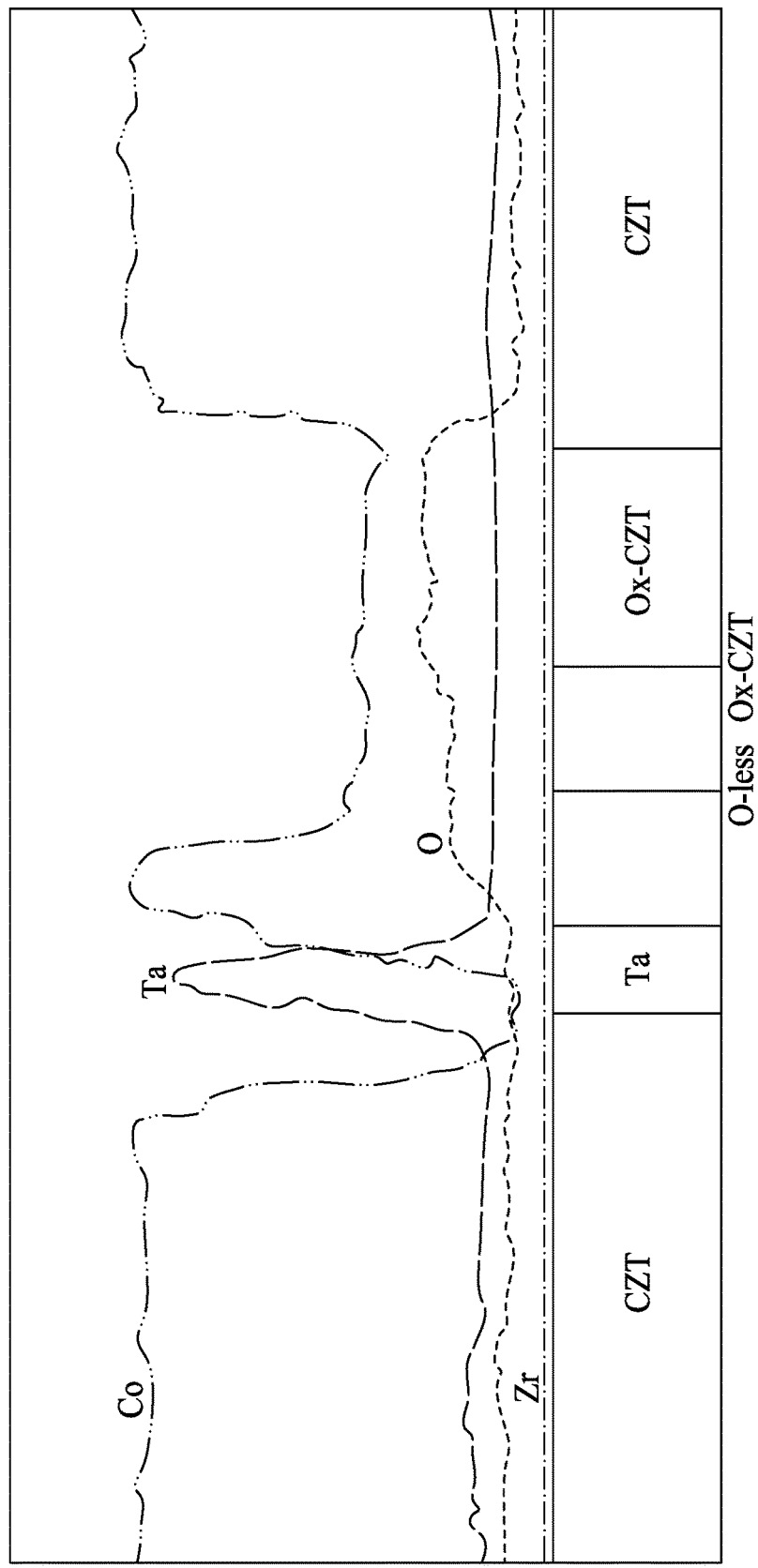
FIG. 6B is a simulation chart illustrating a TEM EDX line scan simulation of a laminated unit with oxygen trapping layer.

FIG. 6A is a simulation chart illustrating a TEM (transmission electron microscopy) EDX (Energy-dispersive X-ray spectroscopy) line scan simulation of a laminated unit without oxygen trapping layer, and FIG. 6B is a simulation chart illustrating a TEM EDX line scan simulation of a laminated unit with oxygen trapping layer. As depicted in FIG. 6A, both the oxygen concentration and the tantalum concentration remain high in the interface between the cap layer (tantalum) and the insulative oxide layer (CZT oxide layer), and it is assumed that tantalum oxide ($Ta_xO_y$) is generated. The etching rate of tantalum oxide is lower than the etching rate of tantalum and CZT, and thus will impede etching of tantalum and CZT, resulting lateral etching. On the other hand, both the oxygen concentration and the tantalum concentration drop sharply as depicted in FIG. 6B. This shows that the oxygen trapping layer traps oxygen atoms and avoids generation of tantalum oxide.

Figure 7:
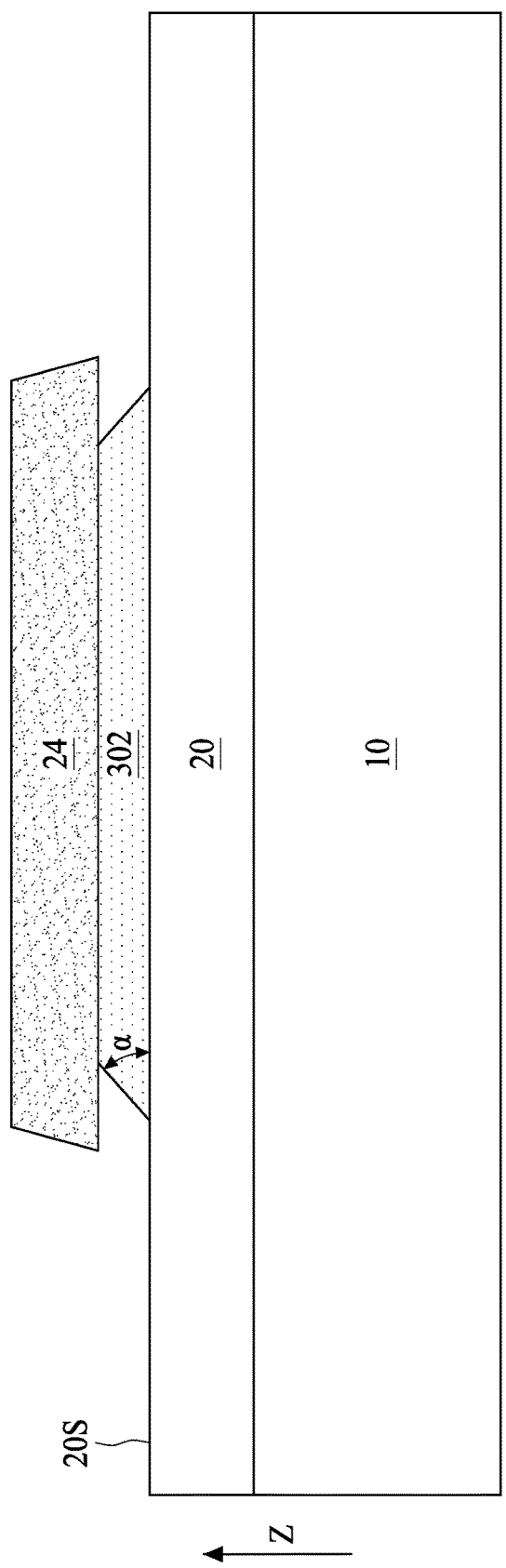
FIG. 7 is a schematic cross-sectional view of some embodiments of a film stack.

FIG. 7 is a schematic cross-sectional view of some embodiments of a film stack 302. As depicted in FIG. 7, after etching operation, the film stack 302 is tapered at an edge due to lateral etching. In some embodiment, the width of the tapered edge in a direction substantially parallel to the external surface 20S of the overlying layer 20 is about 20 micrometers. In some embodiments, the film stack 302 forms an angle α with an external surface 20S of the overlying layer 20, and the angle α ranges e.g., from about 20 degrees to about 50 degrees. In some embodiments, the angle α ranges from about 25 degrees to about 45 degrees, or from about 30 degrees to about 40 degrees.

In the present disclosure, the oxygen trapping layer disposed between the magnetic layer and the cap layer is configured to trap particles such as oxygen atoms and thus prevent oxygen atoms from diffusing to the cap layer. The oxygen trapping layer restrains generation of metal compound which is difficult to be etched, and the lateral etching phenomenon of the film stack is suppressed.

In some embodiments of the present disclosure, a semiconductor structure includes a first magnetic layer, an insulative oxide layer, an oxygen trapping layer and a cap layer. The insulative oxide layer is over the first magnetic layer. The oxygen trapping layer is over the insulative oxide layer. The oxygen concentration of the oxygen trapping layer is less than an oxygen concentration of the insulative oxide layer. The cap layer is over the oxygen trapping layer.

In some embodiments of the present disclosure, an integrated inductor includes a plurality of laminated units stacked to one another. Each laminated unit includes a first cobalt zirconium tantalum (CZT) layer, a CZT oxide layer, an oxygen-less CZT oxide layer and a cap layer. The CZT oxide layer is over the first CZT layer. The oxygen-less CZT oxide layer is over the CZT oxide layer. The oxygen concentration of the oxygen-less CZT oxide layer is less than the oxygen concentration of the CZT oxide layer. The conductive layer is over the oxygen-less CZT oxide layer.

In some embodiments of the present disclosure, a semiconductor device, includes a MOSFET in a semiconductor substrate and a film stack over the semiconductor substrate. The repeated film stack comprises a plurality of laminated unit. At least one of the laminated units includes a first magnetic layer, an insulative oxide layer, an oxygen trapping layer and a cap layer. The insulative oxide layer is over the first magnetic layer. The oxygen trapping layer is over the insulative oxide layer. The oxygen concentration of the oxygen trapping layer is less than the oxygen concentration of the insulative oxide layer. The cap layer is over the oxygen trapping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first magnetic layer;
   an insulative oxide layer over the first magnetic layer;
   an oxygen trapping layer over the insulative oxide layer, wherein the insulative oxide layer and the oxygen trapping layer comprise the same elements and different composition ratios, and an oxygen concentration of the oxygen trapping layer is less than an oxygen concentration of the insulative oxide layer; and
   a cap layer over the oxygen trapping layer.

2. The semiconductor structure of claim 1, wherein the first magnetic layer comprises an alloy comprising cobalt, zirconium, and at least one of tantalum, niobium or rhenium.

3. The semiconductor structure of claim 1, wherein the insulative oxide layer comprises an oxide of cobalt, zirconium and at least one of tantalum, niobium or rhenium, and the oxygen trapping layer comprises an oxide of cobalt, zirconium, and at least one of tantalum, niobium or rhenium.

4. The semiconductor structure of claim 1, wherein
   a ratio of the oxygen concentration of the oxygen trapping layer to the oxygen concentration of the insulative oxide layer ranges from about 10% to about 40%.

5. The semiconductor structure of claim 1, wherein the cap layer is a conductive layer.

6. The semiconductor structure of claim 5, wherein the conductive layer comprises tantalum.

7. The semiconductor structure of claim 1, further comprising a second magnetic layer between the oxygen trapping layer and the cap layer.

8. The semiconductor structure of claim 7, wherein the second magnetic layer comprises an alloy comprising cobalt, zirconium, and at least one of tantalum, niobium or rhenium.

9. The semiconductor structure of claim 1, wherein an etching rate of the first magnetic layer is higher than an etching rate of the insulative oxide layer, and the etching rate of the insulative oxide layer is higher than an etching rate of the cap layer.

10. An integrated inductor, comprising:
    a plurality of laminated units stacked to one another, wherein each of the laminated units comprises:
    a first cobalt zirconium tantalum (CZT) layer;
    a CZT oxide layer over the first CZT layer;
    an oxygen-less CZT oxide layer over the CZT oxide layer, wherein an oxygen concentration of the oxygen-less CZT oxide layer is less than an oxygen concentration of the CZT oxide layer; and
    a conductive layer over the oxygen-less CZT oxide layer.

11. The integrated inductor of claim 10, wherein a ratio of the oxygen concentration of the oxygen-less CZT oxide layer to the oxygen concentration of the CZT oxide layer ranges from about 10% to about 40%.

12. The integrated inductor of claim 10, wherein the conductive layer comprises tantalum.

13. The integrated inductor of claim 10, further comprising a second CZT layer between the oxygen-less CZT oxide layer and the conductive layer.

14. A semiconductor device, comprising:
    a MOSFET in a semiconductor substrate; and
    a film stack over the semiconductor substrate, wherein the repeated film stack comprises a plurality of laminated units, and at least one of the laminated units comprises:
    a first magnetic layer;
    an insulative oxide layer over the first magnetic layer;
    an oxygen trapping layer over the insulative oxide layer, wherein the oxygen trapping layer comprises an oxide, and an oxygen concentration of the oxygen trapping layer is less than an oxygen concentration of the insulative oxide layer; and
    a cap layer over the oxygen trapping layer.

15. The semiconductor device of claim 14, further comprising an overlying layer between the semiconductor substrate and the film stack.

16. The semiconductor device of claim 15, wherein the film stack forms an angle with an external surface of the overlying layer, and the angle ranges from 20 degrees to 50 degrees.

17. The semiconductor device of claim 14, further comprising an insulative layer covering a sidewall of the film stack.

18. The semiconductor device of claim 14, wherein the film stack is configured as an inductor.

19. The semiconductor device of claim 14, wherein the film stack is tapered at an edge.

* * * * *